United States Patent [19]
Pellon

[11] Patent Number: 6,160,506
[45] Date of Patent: Dec. 12, 2000

[54] LOW-NOISE SIGMA-DELTA ANALOG-TO-DIGITAL CONVERTER

[75] Inventor: Leopold Ernest Pellon, Mt. Holly, N.J.

[73] Assignee: Lockheed Martin Corp., Moorestown, N.J.

[21] Appl. No.: 09/260,230

[22] Filed: Mar. 1, 1999

Related U.S. Application Data

[60] Provisional application No. 60/089,025, Jun. 12, 1998.

[51] Int. Cl.$^7$ .................................................... H03M 3/00
[52] U.S. Cl. .......................................... 341/143; 341/155
[58] Field of Search ................................... 341/143, 110, 341/155, 163; 333/109

[56] References Cited

U.S. PATENT DOCUMENTS 5,160,895  11/1992  Siddoway et al. ...................... 330/151

FOREIGN PATENT DOCUMENTS

2232022  11/1990  United Kingdom ............ H03M 3/02

*Primary Examiner*—Peguy JeanPierre
*Attorney, Agent, or Firm*—W. H. Meise; S. D. Weinstein

[57] ABSTRACT

A sigma-delta analog-to-digital feedback converter arrangement (10) achieves low noise and a wide dynamic range by use of a directional coupler (18) as a summing device for generating the difference signal on which the forward sigma-delta analog-to-digital converter (32) operates. The feedback is provided by a digital-to-analog reconstructor (36), which applies the reconstructed analog signal to the tap ($18_3$) of the directional coupler (18), in which the feedback signal is summed with the analog input signal. A low-noise amplifier (28) is coupled to the output of the directional coupler (18) at which the difference signal appears, so the dynamic range of the signal traversing the low-noise amplifier is small. The high isolation between the tap ($18_3$) of the directional coupler (18) and the source of analog signals allows the use of an input bandpass filter (16).

14 Claims, 6 Drawing Sheets

LOW-NOISE SIGMA-DELTA ANALOG-TO-DIGITAL CONVERTER

This patent application claims priority of Provisional patent application serial No. 60/089,025, filed Jun. 12, 1998.

FIELD OF THE INVENTION

This invention relates to analog-to-digital converters (ADC) of the sigma-delta type, and particularly to low-noise sigma-delta analog-to-digital converters using directional couplers in the input summing node.

BACKGROUND OF THE INVENTION

It is always desirable to increase the dynamic range of an analog-to-digital converter. Since the signals upon which digital signal processors often work originate from analog signals, it is important to preserve as much as possible of the original information contained in the analog signal. When the sensor or analog signal source produces a relatively low signal level, it may be difficult to convert the original analog signal into digital form without degrading the signal-to-noise ratio. This is especially true in those cases in which the dynamic range of the signal is large, because low-noise amplifiers inherently tend to have limited dynamic range.

Improved analog-to-digital converters are desired.

SUMMARY OF THE INVENTION

An analog-to-digital converter (ADC) arrangement according to an aspect of the invention converts band-limited analog input signals into digital output signals.

More particularly, an analog-to-digital conversion arrangement according to an aspect of the invention includes a source of first analog signals, preferably band-limited analog signals or signals which do not include a baseband component, to be converted into digital form. A directional coupler is provided, which includes first, second and third ports. The directional coupler is for coupling signals from the first port to the second port, for coupling signals from the third port (a) to the second port with a first attenuation and (b) to the first port with a second attenuation greater than the first attenuation. A first coupling arrangement is coupled to the first port of the directional coupler and to the source of first analog signals, as a result of which the first analog signals are applied to the first port of the directional coupler, and appear at the second port of the directional coupler summed with reconstructed analog signals which are applied to the third port of the directional coupler. Thus, summed signals are generated at the second port of the directional coupler. A filter is provided, which includes an input port and an output port. A second coupling arrangement is coupled to the second port of the directional coupler and to the input port of the filter, for coupling the summed signals to the filter, as a result of which filtered analog signals are generated at the output port of the filter. An analog-to-digital converter includes a signal input port and a digital signal output port. The analog-to-digital converter samples and quantizes signals applied to the input port of the analog-to-digital converter. The input port of the analog-to-digital converter is coupled to the output port of the filter, for receiving filtered analog signals from the filter, and converts the filtered analog signals from the filter into digital signals, which appear at the output port of the analog-to-digital converter. A digital-to-analog converter includes an input port coupled to the output port of the analog-to-digital converter, and also includes an output port. The digital-to-analog converter converts the digital signals produced by the analog-to-digital converter into the reconstructed analog signals which are ultimately applied to the third port of the directional coupler. A feedback coupling arrangement is coupled to the output port of the digital-to-analog converter and to the third port of the directional coupler, for coupling the reconstructed analog signals to the third port of the directional coupler, for thereby forming or defining a feedback loop in which the reconstructed analog signals are summed with the analog signals in a manner which causes the summed signals to represent the difference (an error signal) between the first analog signals and the reconstructed analog signals.

In a particularly advantageous embodiment of the invention, the second coupling arrangement includes a low-noise amplifier, which amplifies the summed signals for application to the filter. In another advantageous avatar, the analog-to-digital converter is an N-bit analog-to-digital converter, and the digital-to-analog converter is an N-bit digital-to-analog converter, and N is an integer. The filter, which may be termed a loop filter, is a continuous-time filter, as opposed to a clocked or time-quantized filter.

According to a further advantageous manifestation of the invention, the first coupling arrangement includes an analog filter. In a preferred embodiment, the directional coupler has attenuation for signals flowing from the first port to the second port which is less than the first attenuation (for signals flowing from the third port and the second port.

According to a most preferred aspect of the invention, the source of first analog signals to be converted into digital form comprises a source of alternating or "ac" analog signals to be converted into digital form.

In another most preferred embodiment of the invention, the third port of the directional coupler is a balanced port, the output port of the digital-to-analog converter is an unbalanced port, and wherein the feedback coupling arrangement comprises a balun for converting between the unbalanced output port of the digital-to-analog converter and the balanced third port of the directional coupler.

According to another aspect of the invention, an analog-to-digital converter, for converting band-limited analog input signals into digital output signals, includes a sigma-delta analog-to-digital converting arrangement, which includes an input port and an output port, for converting difference signals applied to the input port of the analog-to-digital converting arrangement into the digital output signals. The analog-to-digital converter further includes a digital-to-analog converting arrangement including an output port, and also including an input port coupled to the output port of the analog-to-digital converting arrangement, for generating an analog reconstruction of the digital output signals. A summing arrangement includes an input port to which the analog signal is applied. The summing arrangement includes an output port coupled by a first transmission path to the input port of the summing arrangement. The summing arrangement also includes a third port, and further including a second transmission path coupled to the third port. The first and second transmission paths are mutually coupled in a directional manner, so that signals applied to the input and third ports are preferentially coupled to, and summed at, the output port, and so that signals coupling between the input and third ports are attenuated or isolated. An analog reconstruction signal coupling arrangement is coupled to the third port of the summing arrangement and to the digital-to-analog converting arrangement, for coupling the analog reconstruction of the digital output signals to the third port of the summing arrangement. As a result, the difference signal is generated at the output port of the summing arrangement. A difference signal coupling arrangement is coupled to the output port of the summing arrangement and to the input port of the sigma-delta analog-to-digital converting arrangement; in a preferred embodiment, this coupling arrangement includes a low-noise amplifier. A converter according to an advantageous embodiment is one in which the transmission paths of the summing arrangement include transmission lines, and the summing arrangement comprises a fourth port coupled to an end of the second transmission line remote from the third port, and a resistance arrangement coupled to the fourth port of the directional coupler. The resistance of the resistive arrangement is related, and preferably equal to, to the characteristic impedance of the second transmission line.

In another advantageous embodiment, the difference signal coupling arrangement comprises an active device, and the dynamic range of the difference signal traversing the active device is reduced by the action of the sigma-delta analog-to-digital converter, for thereby reducing the dynamic range to which the active device must respond. The active device may include an amplifying means or arrangement, preferably low-noise.

A radar system according to an aspect of the invention comprises a source of radiated analog signals. The radar system also includes an antenna arranged for receiving reflections of the radiated signals from a target. A directional coupler is provided. The directional coupler includes first, second and third ports, for coupling signals from the first port to the second port, for coupling signals from the third port (a) to the second port with a first attenuation and (b) for coupling signals from the third port to the first port with a second attenuation greater than the first attenuation. A first coupling arrangement is coupled to the first port of the directional coupler and to receive the reflected signals, whereby the reflected signals are applied to the first port of the directional coupler, and appear at the second port of the directional coupler summed with reconstructed analog signals applied to the third port of the directional coupler. This results in generation of summed signals at the second port of the directional coupler. A filter is provided in the radar system. The filter includes an input port and an output port. A second coupling arrangement is coupled to the second port of the directional coupler and to the input port of the filter, for coupling the summed signals to the filter, whereby filtered analog signals are generated at the output port of the filter. An analog-to-digital converter includes a signal input port and a digital signal output port, for sampling and quantizing signals applied to the input port of the analog-to-digital converter. The input port of the analog-to-digital converter is coupled to the output port of the filter, for converting filtered analog signals applied from the filter to the signal input port of the analog-to-digital converter into digital signals, which appear at the output port of the analog-to-digital converter. A digital-to-analog converter includes an input port coupled to the output port of the analog-to-digital converter, and also includes an output port, for converting the digital signals produced by the analog-to-digital converter into the reconstructed analog signals. A feedback coupling arrangement is coupled to the output port of the digital-to-analog converter and to the third port of the directional coupler, for coupling the reconstructed analog signals to the third port of the directional coupler, for thereby forming a feedback loop in which the reconstructed analog signals are summed with the analog signals in a manner which causes the summed signals to represent the difference between the first analog signals and the reconstructed analog signals. The radar includes further processing and display means coupled to the output port of the analog-to-digital converter for processing the digital signals for generating a signal for display.

DESCRIPTION OF THE INVENTION

Figure 1:
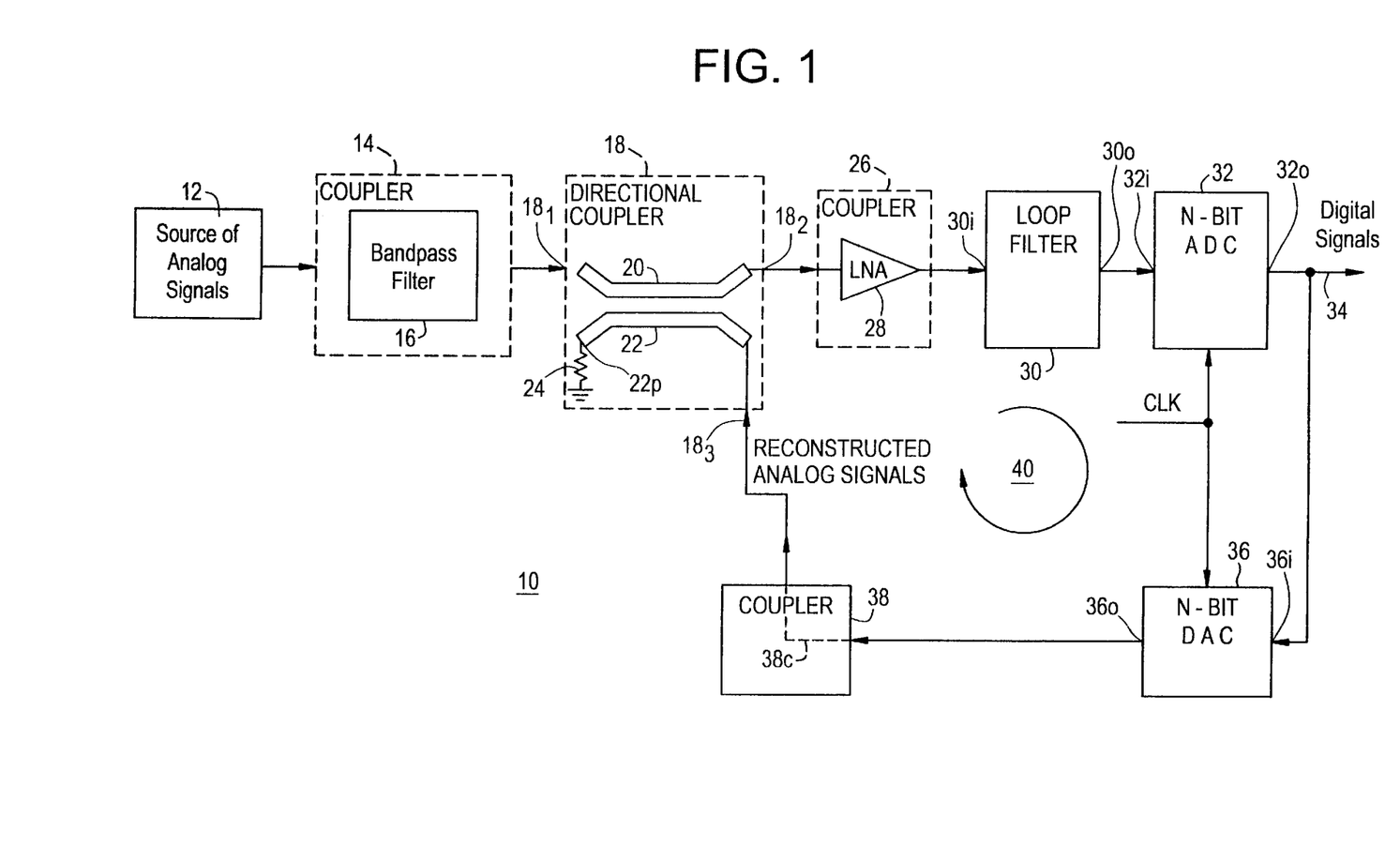
FIG. 1 is a simplified block diagram of an analog-to-digital converter according to an embodiment of the invention, which uses a directional coupler with TEM transmission lines.

FIG. 1 is a simplified block diagram of an analog-to-digital converter (ADC) according to an embodiment of the invention, illustrating a source of analog input signals 12 which are to be converted into digital signals. The analog signals are applied by way of a coupling path 14, which may be a simple electrical conductor or signal path, to an externally accessible input or first port $18_1$ of a directional coupler 18.

Directional coupler 18 includes an externally accessible further output or second port $18_2$ and an externally accessible third port $18_3$. In a particular embodiment of the invention, directional coupler 18 is of the microstrip or coupled TEM (transverse electromagnetic field) transmission-line type, including a first transmission line 20 extending from first port $18_1$ to second port $18_2$, and also includes a second transmission line 22 extending from third port $18_3$ to another port, designated 22P, which may be internal to the directional coupler, or which may be externally accessible. A terminating resistance 24 is coupled to transmission-line 22 at port 22P, all as known to those skilled in the art of directional couplers. The mutual coupling between the transmission lines 20 and 22 results in an easy path (a low-loss path) for transmission between first or input port $18_1$ and second or output port $18_2$. The coupling between third port $18_3$ and the other externally accessible ports can be selected by the design parameters for controlling the mutual coupling. In general, the loss or isolation between third port $18_3$ and second port $18_2$ can be substantially less than the loss or isolation between third port $18_3$ and first port $18_1$.

Those skilled in the art know that directional couplers such as coupler 18 of FIG. 1, and other couplers which may be used in the invention, are not perfect devices, but that transmission between any port and any other port includes losses as well as desired isolation (if any); thus, the attenuation between input or first port $18_1$ of directional coupler 18 and its second or output port $18_2$ is nominally zero dB, but the path will actually have a finite loss, which may vary over the frequency band of the coupler. Similarly, the nominal isolation between the third port $18_3$ and the second or output port $18_2$ may be some value such as, for example, twenty dB, but will actually deviate from this value because of variations in the isolation as a function of frequency, and also because of heating or $I^2R$ losses. Thus, the actual values of loss and isolation of a directional coupler can be expected to deviate from the nominal or specified values.

In the arrangement of FIG. 1, analog signals applied to input port $18_1$ of directional coupler 18 are coupled with relatively low loss to its output port $18_2$. As described in more detail below, reconstructed or reconstituted analog signals are also applied to third port $18_3$ of directional coupler 18, and are coupled with substantial isolation or decoupling to output port $18_2$. Thus, both the analog input signal from source 12 and a reconstructed analog signal are summed together in the directional coupler 18. The summed signal at the output port $18_2$ of directional coupler 18, because of the relative polarity or phase of the analog input signal and the reconstructed signal, represents the difference between the two signals, and is therefore an "error" signal.

The error signal at the output port $18_2$ of directional coupler 18 is applied to a signal coupling arrangement designated as 26. While coupler 26 could be as simple a coupler as an electrical conductor or signal path, in a preferred embodiment of the invention, it is a low-noise amplifier 28. A significant advantage of the invention is that the analog signal itself is not applied to the low-noise amplifier 28, but rather the difference between the analog input signal and the reconstructed analog signal is applied. In other words, the error between the analog input signal and the reconstructed signal is amplified, not the analog input signal itself. Thus, the magnitude of the signal which traverses the low-noise amplifier is reduced, which aids in reducing distortion products attributable to the nonlinearities of the low-noise amplifier. This, in turn, contributes to a low-noise attribute of this aspect of the invention.

The error or difference signal flows from coupling circuit 26 to an input port 30i of a loop filter 30. Loop filter 30 is well known to those in the sigma-delta modulator arts, and requires no further explanation. The filtered signal at an output port 30o of loop filter 30 is applied to an N-bit analog-to-digital converter (ADC) 32, also well known in the art, which quantizes and digitizes the filtered analog signal from the output of loop filter 30. The digitized output signal on output signal path 34 represents the digitized analog input signal, because of the action of the feedback loop of the converter, as described below.

It should be noted that the overall structure 10 of FIG. 1 as a whole constitutes an analog-to-digital converter, and that the overall structure 10 also includes a function 32 which is also an analog-to-digital converter. Those skilled in the art will readily recognize this condition as a conventional one, but it does give rise to a slight ambiguity if the context of the use of the term is not carefully considered. Thus, the overall analog-to-digital converter structure 10 is distinct from analog-to-digital converter block 32.

A digital-to-analog converter (DAC) 36 has an input port 36i coupled to signal path 34, corresponding to the output port 32o of analog-to-digital converter 32. Digital-to-analog converter 36 converts the digital signal on signal path 34 into a corresponding analog signal, which is a reconstruction of the digital value represented by the signal on signal path 34.

The reconstructed analog signal appears at output port 36o of digital-to-analog converter 36, and is applied by way of a signal path, illustrated as a block 38, to third port $18_3$ of directional coupler 18. As in the case of the couplers 14 and 26 described above, coupler 38 may be simply a signal path, as suggested by the dash-line conductor 38c. The connection established by coupling block 38 establishes a feedback loop, by which the reconstructed analog signal is applied to the directional coupler 18 for summing with the analog input signal for generating the error signal. Coupler 38 is illustrated as a discrete block because, if the polarities of the feedback and analog input signals are such that they were to add instead of subtract, block 38 conceptually would be required to contain an inverting transformer. In actual practice, the phase or polarity of the signals can almost always be reversed somewhere along the signal path, so the addition of a discrete inverting device will almost never be necessary. Nevertheless, block 38 is illustrated for clarity. In other situations, if the isolation between third port $18_3$ and second port $18_2$ of directional coupler 18 were high, it might be desirable to amplify the reconstructed analog signal produced by digital-to-analog converter 36 before applying it to the directional coupler, and coupling block 38 might provide such a function.

Another advantage of the arrangement according to an aspect of the invention is that the amount of coupling of the reconstructed analog signal from the third port $18_3$ of the directional coupler to the second port $18_2$ is less affected by the presence of a filter 16 in signal coupling path 14 than would be the case if there were no directivity in the summing coupler. Put another way, if there is, for example, forty dB of isolation or attenuation between third port $18_3$ and first or input port $18_1$ of directional coupler 18, the effect of the in-band versus the out-of-band impedances of the filter 16 will have little effect on the coupling between third port $18_3$ and second port $18_2$. If the coupler were not directional, the isolation or attenuation between third port $18_3$ and the other two external ports $18_1$ and $18_2$ would be the same, and if high isolation, as for example forty or fifty dB were desired between third port $18_3$ and first port $18_1$, the same isolation would have to be accepted between third port $18_3$ and second port $18_2$. This, in turn, might require amplification of a like amount within signal coupler 38.

The type of directional coupler 18 illustrated in FIG. 1 uses long, parallel transmission-lines to effect its coupling. those skilled in the art know that in order to function effectively, such transmission-lines must be relatively long by comparison with a wavelength. For example, most such couplers have transmission-line segments which have a length of about one-quarter wavelength at the lowest frequency of operation. For operation over some frequency bands, such lengths are inconvenient. For example, at 10 MHz, one wavelength is about 100 feet long, and one-quarter wavelength would be about 25 feet; two quarter-wavelength transmission lines at 10 MHz might be difficult to construct, and lower frequencies would entail correspondingly longer transmission lines.

Figure 2:
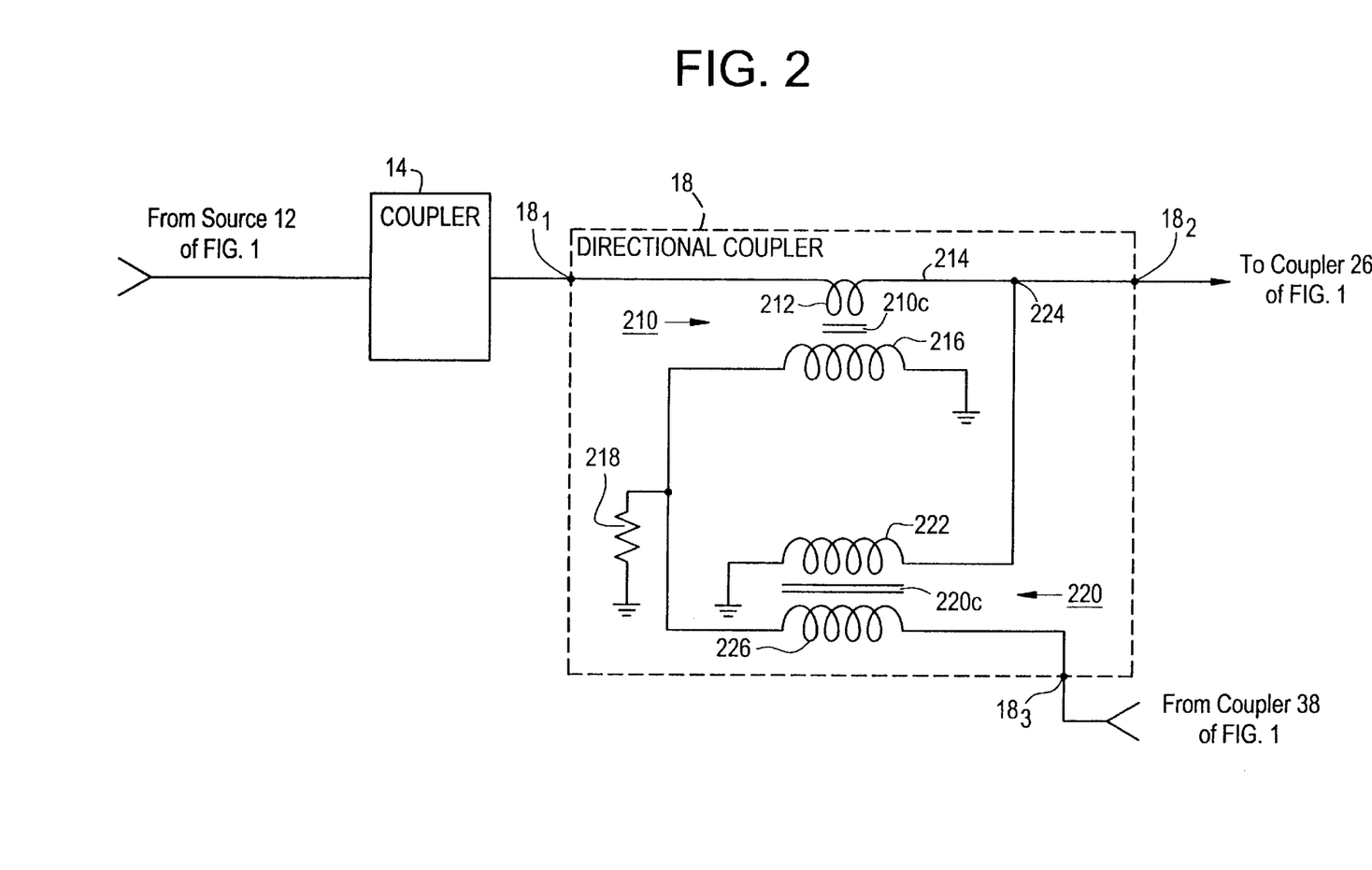
FIG. 2 is a simplified diagram, in block and schematic form, of a directional coupler which may be used in the arrangement of FIG. 1 instead of the TEM directional coupler.

According to an aspect of the invention, the directional coupler may include magnetic-core components so as to allow operation at lower frequencies with smaller devices. One such device is illustrated in FIG. 2. In FIG. 2, elements corresponding to those of FIG. 1 are designated by the same reference numerals. In FIG. 2, directional coupler 18 includes a first transformer with a first winding 212 coupled in a series signal path or conductor 214 extending between input port $18_1$ and output port $18_2$, for responding to current flow in path 214, and for coupling energy by way of a magnetic core 210C to a secondary winding 216. Secondary winding 216 is grounded at one end, and coupled to a terminating resistance 218 at its other end. The arrangement of transformer 210 and resistance 218 may be viewed as being an arrangement for generating a voltage across resistance 218 in response to the current on conductor or signal path 214.

Also in FIG. 2, a second transformer designated generally as 220 includes a magnetic core 220C, a first winding 222 connected between ground and a tap point 224 on signal path or conductor 214, and a second winding 226 coupled to winding 222 by way of core 220C. A first end of winding 226 is coupled to resistive termination 218, and its other end is coupled to third signal port $18_3$, for receiving the reconstructed analog signal from coupler 38.

The theoretical basis of operation of a directional coupler 18 of the type shown in FIG. 2 is the same as that of the TEM coupler described in conjunction with FIG. 1, and is not essential to an understanding of the invention. The coupler of FIG. 2 provides the same kind of directional behavior as that described for the directional coupler 18 of FIG. 1, but does so over a bandwidth which can be made to be greater than that of the FIG. 1 version, and operation at low frequencies can be obtained with a relatively small structure.

It should be noted that the transmission lines as so far described are of the type known as "unbalanced" transmission lines. Unbalanced transmission lines can be generally characterized as being those in which the conductors which define the transmission line are unequal in cross-sectional dimensions. The transmission lines illustrated in FIG. 1 are simplified, in that they assume the existence of a ground plane, which is not illustrated or expressly addressed. This ground plane is common to both of the transmission lines 20 and 22, and underlies both. In this situation, it is easy to understand that in cross-section, the transmission-line structures 20, 22 of FIG. 1 are quite unbalanced, because each transmission line 20, 22 has a finite cross-section, whereas the ground plane, in principle, is infinitely broad. Thus, there is a lack of symmetry between the conductors of transmission lines 20, 22 and their underlying ground plane, whereupon the transmission lines are "unbalanced."

Figure 3:
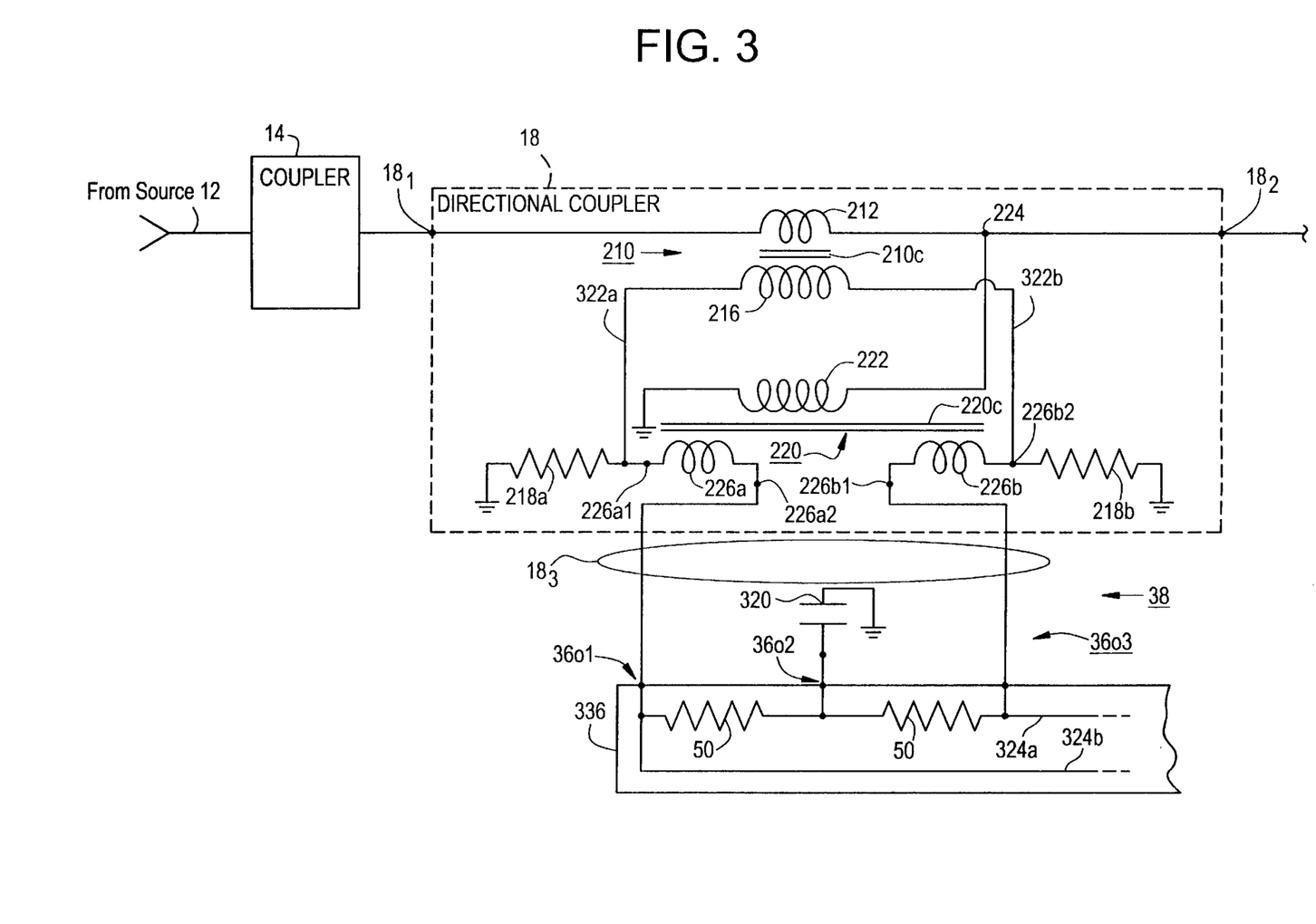
FIG. 3 is a simplified diagram, in block and schematic form, of a balanced directional coupler similar to the directional coupler of FIG. 2.

In some cases, the output signal of the digital-to-analog converter 36 of FIG. 1 may be in balanced form, rather than unbalanced. Ordinarily, a balanced-to-unbalanced converter (balun) is used to provide a transition between a balanced and an unbalanced path. However, a balun has its own bandwidth limitations, and these limitations may not be desirable. According to a further aspect of the invention, a balun is integrated into a directional coupler of the general type described in conjunction with FIG. 2, for use with a balanced-output digital-to-analog converter. In FIG. 3, elements having functions corresponding to those of FIG. 2 are designated by like reference numerals. More particularly, the arrangement of FIG. 3 includes a series winding 212, core 210c, and additional winding 216 of a transformer 210, with the winding 212 connected as in FIG. 2. A second transformer 220 includes a magnetic core 220C with a first winding 222 coupled to a tap 224 as in FIG. 2. However, the second winding of transformer 220 is split into two portions, namely portions 226a and 226b. A first end 226a1 of winding 226a is connected to a terminating resistance or resistor 218a and, by way of a path 322a to a first end of transformer winding 216. A first end 226b2 of winding 226b is connected to a terminating resistance 218b and, by way of a signal path 322b, to a second end of transformer winding 216. The remaining two terminals 226a2 and 226b1 of transformer 220 windings 226a and 226b, respectively, together constitute a balanced port corresponding to port $18_3$ of FIG. 2, and are so designated in FIG. 3.

As further illustrated in FIG. 3, the output portion 336 of digital-to-analog converter 36 of FIG. 1 includes internal balanced conductors 324a and 324b on which the desired reconstructed analog signal is generated. Conductors 324a and 324b are connected to external terminals or electrodes 36o1 and 36o3, respectively. Also, each conductor 324a and 324b is connected by a terminating resistor, illustrated by the designation 50, to an external port 36o2. Terminal 36o2 is connected to ground by way of a direct-current (DC) blocking capacitor 320. The structure illustrated in FIG. 3 couples the balanced output port of the analog-to-digital converter to the directional coupler 18 without the need for a discrete intermediary balun, which reduces cost, but more importantly improves the bandwidth and loss characteristics of the structure.

Figure 4:
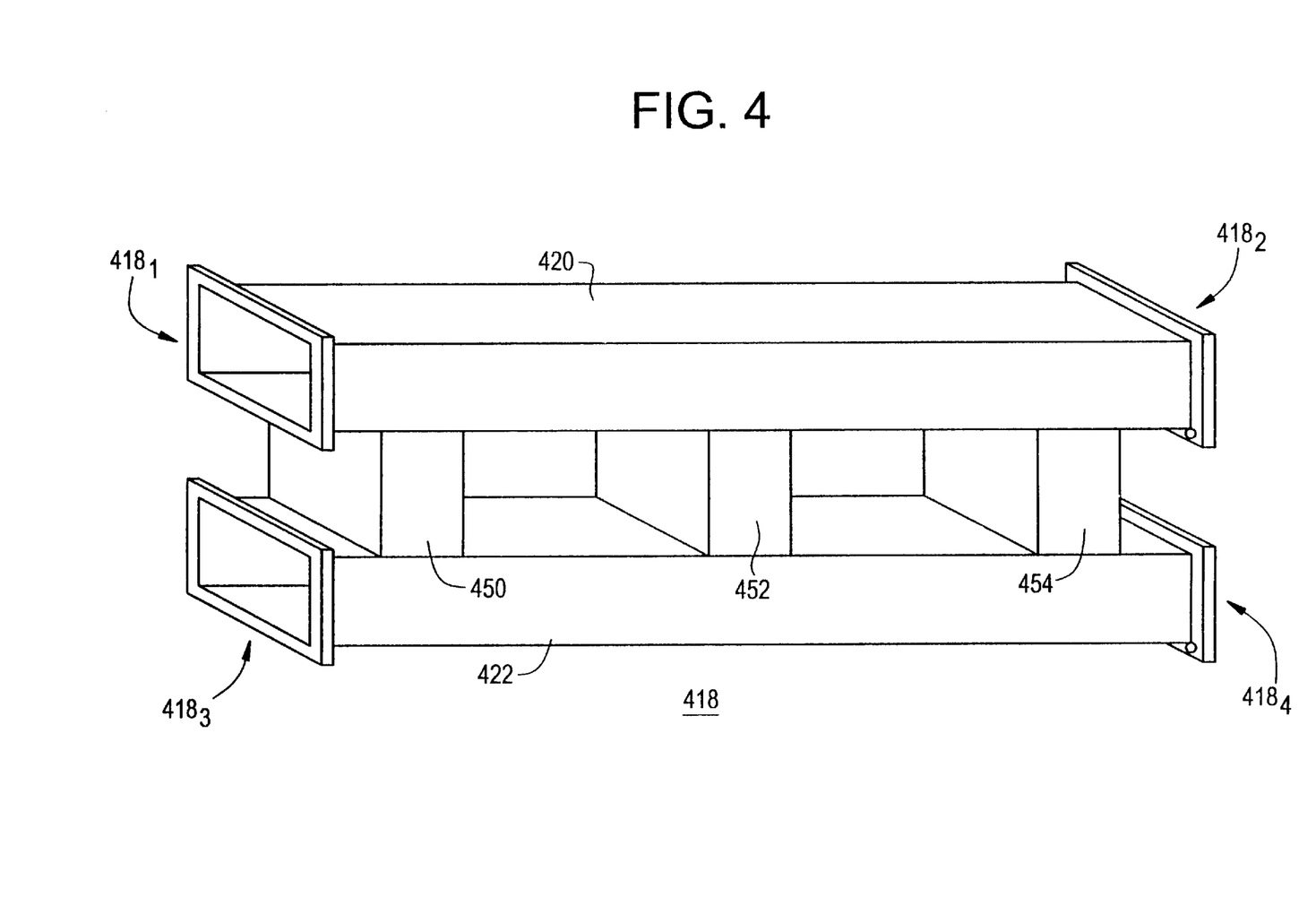
FIG. 4 is a simplified perspective or isometric view of a waveguide directional coupler which may be used in the arrangement of FIG. 1 at some frequencies.

FIG. 4 illustrates another type of directional coupler which may be used in some frequency bands. In FIG. 4, a rectangular waveguide 420 constitutes a first transmission line extending from waveguide port $418_1$, to port $418_2$d. Another rectangular waveguide 422 extends from a waveguide port $418_3$ to a further waveguide port $418_4$. Rectangular waveguides 420 and 422 correspond to transmission lines 20 and 22 of FIG. 1. Coupling between waveguides 420 and 422 to provide directivity is accomplished by means of a plurality, illustrated in FIG. 4 as three, short sections 450, 452, and 454 extending between waveguides 420 and 422 at various positions along the lengths of the waveguides. Those skilled in the art know how to dimension the waveguides to provide directivity at the desired frequencies. A waveguide termination may be coupled to the unused port, as required.

Figure 5:
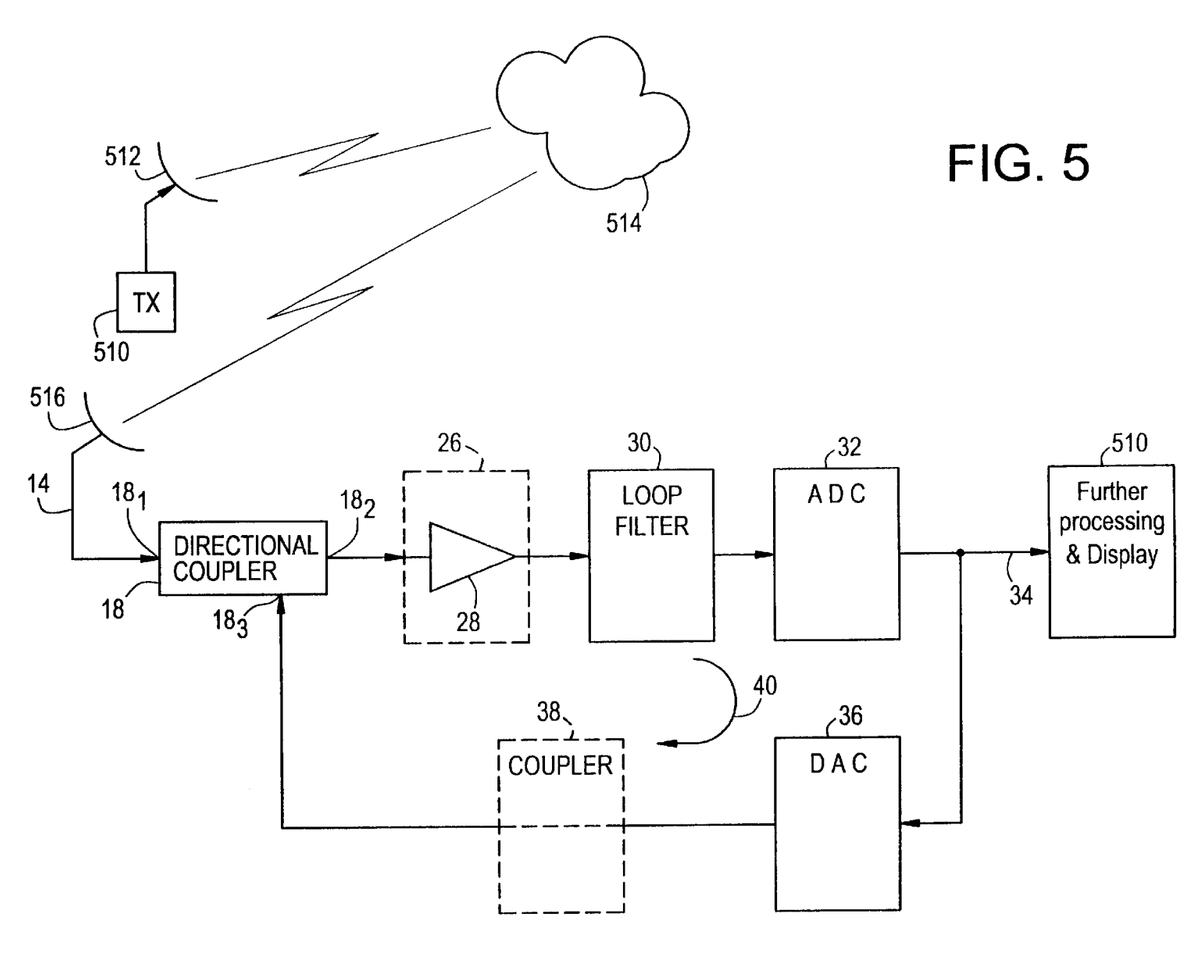
FIG. 5 is a simplified block diagram of a detection system in the form of a radar system which may advantageously use an analog-to-digital converter according to an aspect of the invention.

The invention finds a particularly advantageous use in detection systems which rely on recognition of faint signals from distant, low-emission or low-reflectivity targets. In this context, the word "target" is given a broad or technical meaning. As an example of such a detecting system, FIG. 5 is a simplified block diagram of a radar system according to an aspect of the invention, in which a transmitter (TX) 510 is coupled to a transmitting antenna 512 for transmitting electromagnetic signals toward a target 514. While many radar systems use the same antenna for both transmission and reflection, for generality the system of FIG. 5 uses a separate antenna 516 for receiving echoes from target 514. Antenna 516 is coupled by a path 14, which may contain other elements, as for example a filter corresponding to filter 16 of FIG. 1, to input port $18_1$ of a directional coupler 18. Directional coupler 18 may be any type of directional coupler described above, or any other conventional type. The summed or error output from output port $18_2$ of directional coupler 18 is coupled to a low-noise amplifier 28 of a coupler 26. The amplified error signal at the output port of coupler 26 is applied by way of a loop filter 30 to an ADC 32, which produces the digital signals, which are applied over a signal path 34 to a block 510. Block 510 represents other signal processing performed in the radar system, and also represents the display of the results of the processing, either on a monitor or in digital data form for transmission to another device which uses the radar signals. Such a device might be, for example, an aircraft control processor for air traffic control. The digital signals on signal path 34 are also applied to DAC 36 for generating the reconstructed or reconstituted analog signals, and the analog signals so reconstructed are applied by way of a signal path, illustrated as coupler block 38, back to the third port $18_3$ of directional coupler 18, to thereby close feedback loop 40.

Figure 6:
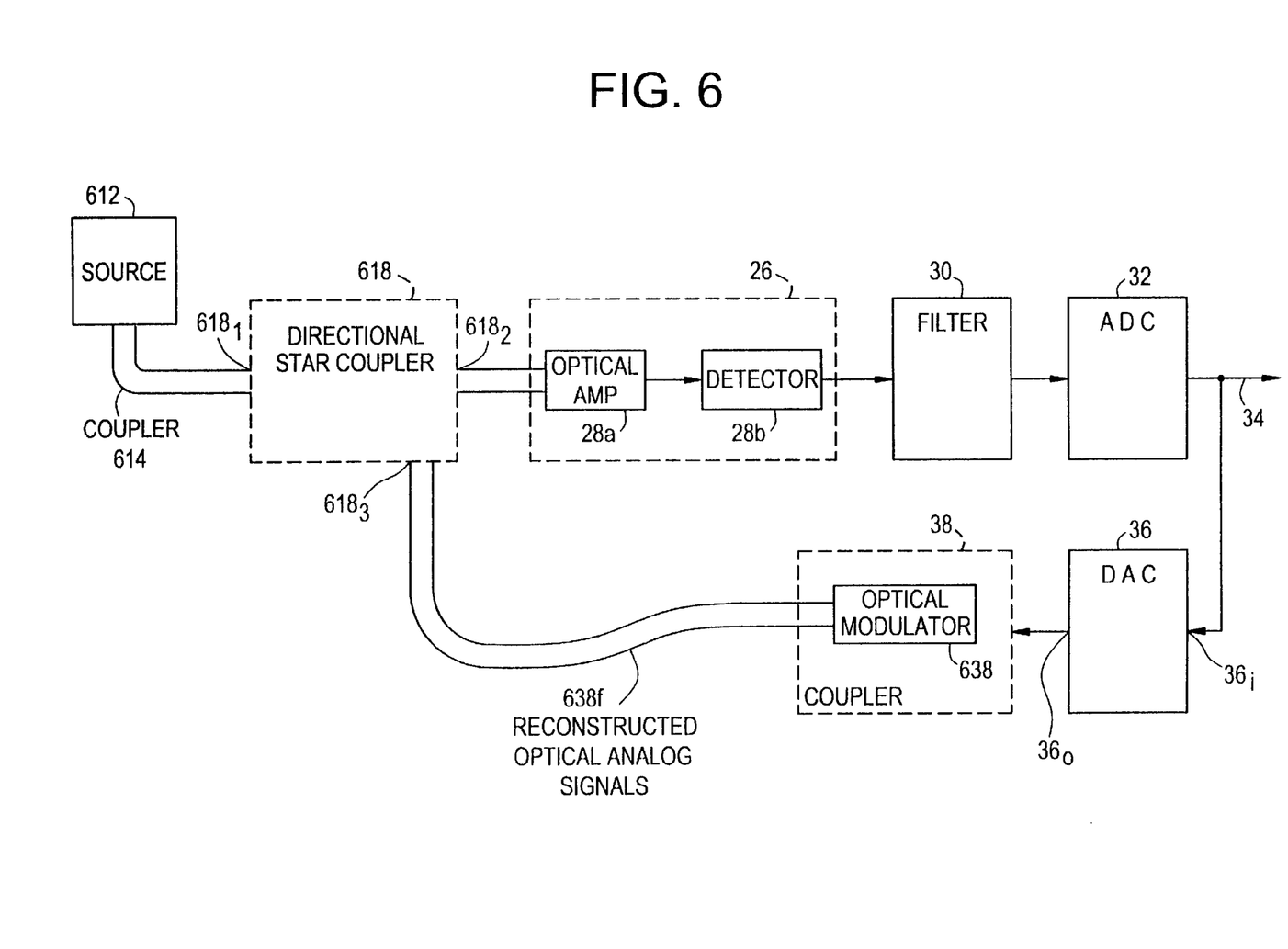
FIG. 6 is a simplified block diagram of a detection system in the form of an optical receiver which may advantageously use an analog-to-digital converter according to an aspect of the invention.

FIG. 6 illustrates an optical system using the invention. In FIG. 6, a source 612 of optical electromagnetic signals couples light over a coupling path 614, which may be bandlimited, to an input port $618_1$ of a directional light coupler 618. Such couplers for light are well known as "star" couplers and the like. Coupler 618 includes a second port $618_2$ at which the sum or superposition of the signals applied to input ports $618_1$ and $618_3$ is generated. The summed signal at output port $618_2$ is applied by way of a coupling path 26 to a loop filter 30. Coupling path 26 may include an optical amplifier and an optical-to-electrical converter such as a detector diode arrangement. The filtered signal from filter 30 is applied to ADC 32, where the digital signals are generated, and the digital signals are applied to an output path 34 and to DAC 36. The DAC generates the reconstructed analog signal from the digital signal on signal path 34, and applies it to an optical modulator 638, which is part of coupler 38. Modulator 638 converts the electrical reconstructed analog signal into an optical reconstructed analog signal, which is applied over an optical fiber 638f to input port $618_3$ of star coupler 618.

Other embodiments of the invention will be apparent to those skilled in the art. For example, while the analog input signals should be band-limited to avoid aliasing and saturation or instability of out-of-band signals, there is no necessary requirement that a discrete filter be used to limit the signals. The low-noise amplifier can be a two-terminal negative-resistance amplifier such as a tunnel diode, or it can include a three-terminal amplifier arrangement. Other directive structures are known, for various kinds of transmission lines, and some such directive structures are variously known as circulators, hybrids, and the like. In principle, there is no reason that such directive structures cannot be used in conjunction with the invention. Other potential uses include such systems as weather phenomenon detection radar, sonar systems, passive infrared heat-detection systems, and the like.

Thus, an analog-to-digital converter arrangement (10) according to an aspect of the invention converts band-limited analog input signals into digital output signals.

An analog-to-digital conversion arrangement (10) according to an aspect of the invention includes a source (12) of first analog signals, preferably band-limited analog signals or signals which do not include a baseband component, to be converted into digital form. A directional coupler (18) is provided, which includes first ($18_1$), second ($18_2$) and third ($18_3$) ports. The directional coupler (18) is for coupling signals from the first port ($18_1$) to the second port ($18_2$), for coupling signals from the third port ($18_3$) (a) to the second port ($18_2$) with a first attenuation and (b) to the first port ($18_1$) with a second attenuation greater than the first attenuation. A first coupling arrangement (14) is coupled to the first port ($18_1$) of the directional coupler (18) and to the source (12) of first analog signals, as a result of which the first analog signals are applied to the first port ($18_1$) of the directional coupler (18), and appear at the second port ($18_2$) of the directional coupler (18) summed with reconstructed analog signals which are applied to the third port ($18_3$) of the directional coupler (18). Thus, summed signals are generated at the second port ($18_2$) of the directional coupler (18). A filter (30) is provided, which includes an input port (30i) and an output port (30o). A second coupling arrangement (26) is coupled to the second port ($18_2$) of the directional coupler (18) and to the input port (30i) of the filter (30), for coupling the summed signals to the filter (30), as a result of which filtered analog signals are generated at the output port (30o) of the filter (30). An analog-to-digital converter (32) includes a signal input port (32i) and a digital signal output port (32o). The analog-to-digital converter (32) samples and quantizes signals applied to the input port (32i) of the analog-to-digital converter (32). The input port (32i) of the analog-to-digital converter (32) is coupled to the output port (30o) of the filter (30), for receiving filtered analog signals from the filter, and converts the filtered analog signals from the filter (30) into digital signals, which appear at the output port (32o) of the analog-to-digital converter (32). A digital-to-analog converter (36) includes an input port (36i) coupled to the output port (32o) of the analog-to-digital converter (32), and also includes an output port (36o). The digital-to-analog converter (36) converts the digital signals produced by the analog-to-digital converter (32) into the reconstructed analog signals which are ultimately applied to the third port ($18_3$) of the directional coupler (18). A feedback coupling arrangement (38) is coupled to the output port (36o) of the digital-to-analog converter (36) and to the third port ($18_3$) of the directional coupler (18), for coupling the reconstructed analog signals to the third port ($18_3$) of the directional coupler (18), for thereby forming or defining a feedback loop (40) in which the reconstructed analog signals are summed with the analog signals in a manner which causes the summed signals to represent the difference (an error signal) between the first analog signals and the reconstructed analog signals.

In a particularly advantageous embodiment of the invention, the second coupling arrangement (26) includes a low-noise amplifier (28), which amplifies the summed signals for application to the filter (30). In another advantageous avatar, the analog-to-digital converter (32) is an N-bit analog-to-digital converter (32), and the digital-to-analog converter (36) is an N-bit digital-to-analog converter (36), and N is an integer. The filter (30), which may be termed a loop filter, is a continuous-time filter (30), as opposed to a clocked or time-quantized filter.

According to a further advantageous manifestation of the invention, the first coupling arrangement (14) includes an analog filter (16). In a preferred embodiment, the directional coupler (18) has attenuation for signals flowing from the first ($18_1$) port to the second ($18_2$) port which is less than the first attenuation (for signals flowing from the third port ($18_3$) and the second port ($18_2$).

According to a most preferred aspect of the invention, the source (12) of first analog signals to be converted into digital form comprises a source of alternating or "ac" analog signals to be converted into digital form.

In another most preferred embodiment of the invention, the third port ($18_3$) of the directional coupler (18) is a balanced port, the output port (36o) of the digital-to-analog converter (36) is an unbalanced port, and wherein the feedback coupling arrangement (38) comprises a balun for converting between the unbalanced output port (36o) of the digital-to-analog converter (36) and the balanced third port ($18_3$) of the directional coupler (18).

According to another aspect of the invention, an analog-to-digital converter (10), for converting band-limited analog input signals into digital output signals, includes a sigma-delta analog-to-digital converting arrangement (32), which includes an input port (32i) and an output port (32o), for converting difference signals applied to the input port (32i) of the analog-to-digital converting arrangement (32) into the digital output signals. The analog-to-digital converter (10) further includes a digital-to-analog converting arrangement (36) including an output port (36o), and also including an input port (36i) coupled to the output port (32o) of the analog-to-digital converting arrangement (32), for generating an analog reconstruction of the digital output signals. A summing arrangement (18) includes an input port (18₁) to which the analog signal is applied. The summing arrangement (18) includes an output port (18₂) coupled by a first transmission path (20) to the input port (18₁) of the summing arrangement (18). The summing arrangement (18) also includes a third port (18₃), and further including a second transmission path (22) coupled to the third port (18₃). The first (20) and second (22) transmission paths are mutually coupled in a directional manner, so that signals applied to the input (18₁) and third (18₃) ports are preferentially coupled to, and summed at, the output port (18₂), and so that signals coupling between the input (18₁) and third (18₃) ports are attenuated or isolated. An analog reconstruction signal coupling arrangement (38) is coupled to the third (18₃) port of the summing arrangement (18) and to the digital-to-analog converting arrangement (36), for coupling the analog reconstruction of the digital output signals to the third port (18₃) of the summing arrangement (18). As a result, the difference signal is generated at the output port (18₂) of the summing arrangement (18). A difference signal coupling arrangement (26) is coupled to the output port (18₂) of the summing arrangement (18) and to the input port (32i) of the sigma-delta analog-to-digital converting arrangement (32); in a preferred embodiment, this coupling arrangement includes a low-noise amplifier. A converter according to an advantageous embodiment is one in which the transmission paths of the summing arrangement (18) include transmission lines, and the summing arrangement comprises a fourth port (22p) coupled to an end of the second transmission line (22) remote from the third port (18₃), and a resistance arrangement (24) coupled to the fourth port (22p) of the directional coupler (18). The resistance of the resistive arrangement (24) is related, and preferably equal to, to the characteristic impedance of the second transmission line (22).

In another advantageous embodiment, the difference signal coupling arrangement (26) comprises an active device (28), and the dynamic range of the difference signal traversing the active device is reduced by the action of the sigma-delta analog-to-digital converter, for thereby reducing the dynamic range to which the active device must respond. The active device (28) may include an amplifying means or arrangement, preferably low-noise.

A radar system according to an aspect of the invention comprises a source (510, 512) of radiated analog signals. The radar system also includes an antenna (516) arranged for receiving reflections of the radiated signals from a target (514). A directional coupler (18) is provided. The directional coupler includes first (18₁), second (18₂) and third (18₃) ports, for coupling signals from the first port (18₁) to the second port (18₂), for coupling signals from the third port (18₃) (a) to the second port (18₂) with a first attenuation and (b) for coupling signals from the third port (18₃) to the first port (18₁) with a second attenuation greater than the first attenuation. A first coupling arrangement (14) is coupled to the first port (18₁) of the directional coupler (18) and to receive the reflected signals, whereby the reflected signals are applied to the first port (18₁) of the directional coupler (18), and appear at the second port (18₂) of the directional coupler (18) summed with reconstructed analog signals applied to the third port (18₃) of the directional coupler (18). This results in generation of summed signals at the second port (18₂) of the directional coupler (18). A filter (30) is provided in the radar system. The filter includes an input port and an output port. A second coupling arrangement (26) is coupled to the second port (18₂) of the directional coupler (18) and to the input port of the filter (30), for coupling the summed signals to the filter (30), whereby filtered analog signals are generated at the output port of the filter (30). An analog-to-digital converter (32) includes a signal input port and a digital signal output port, for sampling and quantizing signals applied to the input port of the analog-to-digital converter (32). The input port of the analog-to-digital converter (32) is coupled to the output port of the filter (30), for converting filtered analog signals applied from the filter (30) to the signal input port of the analog-to-digital converter (32) into digital signals, which appear at the output port of the analog-to-digital converter (32). A digital-to-analog converter (36) includes an input port coupled to the output port of the analog-to-digital converter (32), and also includes an output port, for converting the digital signals produced by the analog-to-digital converter (32) into the reconstructed analog signals. A feedback coupling arrangement (38) is coupled to the output port of the digital-to-analog converter (36) and to the third port (18₃) of the directional coupler (18), for coupling the reconstructed analog signals to the third port (18₃) of the directional coupler (18), for thereby forming a feedback loop (40) in which the reconstructed analog signals are summed with the analog signals in a manner which causes the summed signals to represent the difference between the first analog signals and the reconstructed analog signals. The radar includes further processing and display means (510) coupled to the output port of the analog-to-digital converter (32) for processing the digital signals for generating a signal for display.

What is claimed is:

1. An analog-to-digital conversion arrangement, comprising:

a source of first analog signals to be converted into digital form;

a directional coupler including first, second and third ports, for coupling signals from said first port to said second port, for coupling signals from said third port (a) to said second port with a first attenuation and (b) for coupling signals from said third port to said first port with a second attenuation greater than said first attenuation;

first coupling means coupled to said first port of said directional coupler and to said source of first analog signals, whereby said first analog signals are applied to said first port of said directional coupler, and appear at said second port of said directional coupler summed with reconstructed analog signals applied to said third port of said directional coupler, whereby summed signals are generated at said second port of said directional coupler;

a filter including an input port and an output port;

second coupling means coupled to said second port of said directional coupler and to said input port of said filter, for coupling said summed signals to said filter, whereby filtered analog signals are generated at said output port of said filter;

an analog-to-digital converter including a signal input port and a digital signal output port, for sampling and quantizing signals applied to said input port of said analog-to-digital converter, said input port of said analog-to-digital converter being coupled to said output port of said filter, for converting filtered analog signals applied from said filter to said signal input port of said analog-to-digital converter into digital signals, which appear at said output port of said analog-to-digital converter;

a digital-to-analog converter including an input port coupled to said output port of said analog-to-digital converter, and also including an output port, for converting said digital signals produced by said analog-to-digital converter into said reconstructed analog signals;

feedback coupling means coupled to said output port of said digital-to-analog converter and to said third port of said directional coupler, for coupling said reconstructed analog signals to said third port of said directional coupler, for thereby forming a feedback loop in which said reconstructed analog signals are summed with said analog signals in a manner which causes said summed signals to represent the difference between said first analog signals and said reconstructed analog signals.

2. An analog-to-digital conversion arrangement according to claim 1, wherein said second coupling means comprises a low-noise amplifier, which amplifies said summed signals for application to said filter.

3. An analog-to-digital conversion arrangement according to claim 1, wherein said analog-to-digital converter is an N-bit analog-to-digital converter, and said digital-to-analog converter is an N-bit digital-to-analog converter, and N is an integer.

4. An analog-to-digital conversion arrangement according to claim 1, wherein said filter is a continuous-time filter.

5. An analog-to-digital conversion arrangement according to claim 1, wherein said first coupling means comprises a second analog filter.

6. An analog-to-digital conversion arrangement according to claim 1, wherein said directional coupler has attenuation for signals flowing from said first port to said second port which is less than said first attenuation for signals flowing from said third port and said second port.

7. An analog-to-digital conversion arrangement according to claim 1, wherein said source of first analog signals to be converted into digital form comprises a source of alternating analog signals to be converted into digital form.

8. An analog-to-digital conversion arrangement according to claim 1, wherein said third port of said directional coupler is a balanced port, said output port of said digital-to-analog converter is an unbalanced port, and wherein said feedback coupling means comprises a balun for converting between said unbalanced output port of said digital-to-analog converter and said balanced third port of said directional coupler.

9. An analog-to-digital converter for converting band-limited analog input signals into digital output signals, said analog-to-digital converter comprising:

a sigma-delta analog-to-digital converting means including an input port and an output port, for converting difference signals applied to said input port of said analog-to-digital converting means into said digital output signals;

a digital-to-analog converting means including an output port, and also including an input port coupled to said output port of said analog-to-digital converting means, for generating an analog reconstruction of said digital output signals;

summing means including an input port to which said analog signal is applied, said summing means including an output port coupled by a first transmission path to said input port of said summing means, said summing means also including a third port, and further including a second transmission path coupled to said third port, said first and second transmission paths being mutually coupled in a directional manner, so that signals applied to said input and third ports are preferentially coupled to, and summed at, said output port, and signals coupling between said input and third ports are attenuated;

analog reconstruction signal coupling means coupled to said third port of said summing means and to said digital-to-analog converting means, for coupling said analog reconstruction of said digital output signals to said third port of said summing means, whereby said difference signal is generated at said output port of said summing means (180; and difference signal coupling means coupled to said output port of said summing means and to said input port of said sigma-delta analog-to-digital converting means.

10. A converter according to claim 9, wherein said summing means comprises a directional coupler with a fourth port coupled to an end of said second transmission line remote from said third port; and resistive means coupled to said fourth port of said directional coupler, the resistance of said resistive means being related to the characteristic impedance of said second transmission line.

11. A converter according to claim 9, wherein said difference signal coupling means comprises an active device, and the dynamic range of said difference signal traversing said active device is reduced by the action of said sigma-delta analog-to-digital converter, for thereby reducing the dynamic range to which said active device must respond.

12. A converter according to claim 11, wherein said active device includes amplifying means.

13. A converter according to claim 12, wherein said amplifying means includes a low-noise amplifier.

14. A radar system, comprising:

a source (510, 512) of radiated analog signals:

an antenna (516) arranged for receiving reflections of said radiated signals from a target (514):

a directional coupler (18) including first (18$_1$), second (18$_2$) and third (18$_3$) ports, for coupling signals from said first port (18$_1$) to said second port (18$_2$), for coupling signals from said third port (18$_3$) (a) to said second port (18$_2$) with a first attenuation and (b) for coupling signals from said third port (18$_3$) to said first port (18$_1$) with a second attenuation greater than said first attenuation;

first coupling means (14) coupled to said first port (18$_1$) of said directional coupler (18) and to receive said reflected signals, whereby said reflected signals are applied to said first port (18$_1$) of said directional coupler (18), and appear at said second port (18$_2$) of said directional coupler (18) summed with reconstructed analog signals applied to said third port (18$_3$) of said directional coupler (18), whereby summed signals are generated at said second port (18$_2$) of said directional coupler (18);

a filter (30) including an input port and an output port;

second coupling means (26) coupled to said second port (18$_2$) of said directional coupler (18) and to said input port of said filter (30), for coupling said summed signals to said filter (30), whereby filtered analog signals are generated at said output port of said filter (30);

an analog-to-digital converter (32) including a signal input port and a digital signal output port, for sampling and quantizing signals applied to said input port of said analog-to-digital converter (32), said input port of said analog-to-digital converter (32) being coupled to said output port of said filter (30), for converting filtered analog signals applied from said filter (30) to said signal input port of said analog-to-digital converter (32) into digital signals, which appear at said output port of said analog-to-digital converter (32);

a digital-to-analog converter (36) including an input port coupled to said output port of said analog-to-digital converter (32), and also including an output port, for converting said digital signals produced by said analog-to-digital converter (32) into said reconstructed analog signals;

feedback coupling means (38) coupled to said output port of said digital-to-analog converter (36) and to said third port (18$_3$) of said directional coupler (18), for coupling said reconstructed analog signals to said third port (18$_3$) of said directional coupler (18), for thereby forming a feedback loop (40) in which said reconstructed analog signals are summed with said analog signals in a manner which causes said summed signals to represent the difference between said first analog signals and said reconstructed analog signals; and further processing and display means (510) coupled to said output port of said analog-to-digital converter (32) for processing said digital signals for generating a signal for display.

\* \* \* \* \*